United States Patent [19]

Basta

[11] 4,190,311
[45] Feb. 26, 1980

[54] LOW-PROFILE TEST CLIP ADAPTER

[75] Inventor: Thomas P. Basta, Aloha, Oreg.

[73] Assignee: Tektronix, Inc., Beaverton, Oreg.

[21] Appl. No.: 14,794

[22] Filed: Feb. 26, 1979

Related U.S. Application Data

[63] Continuation of Ser. No. 883,983, Mar. 6, 1978, abandoned.

[51] Int. Cl.$^2$ .................. H05K 1/04; H01R 13/54
[52] U.S. Cl. .................. 339/75 MP; 324/158 F; 339/176 MF; 339/200 P
[58] Field of Search ........... 339/17 F, 17 CF, 75 MP, 339/255 P, 259 R, 261, 200 P, 176 MF; 324/158 P, 158 F

[56] References Cited

U.S. PATENT DOCUMENTS 3,444,506  5/1969  Wedekind .................. 339/99 R

FOREIGN PATENT DOCUMENTS 2147377  3/1973  Fed. Rep. of Germany ....... 339/255 P
7593  of 1910  United Kingdom .................. 339/255 P
1246101  9/1971  United Kingdom .................. 324/158 F

*Primary Examiner*—Neil Abrams
*Attorney, Agent, or Firm*—William D. Haffner; Adrian J. LaRue

[57] ABSTRACT

A clip for connecting an electrical component to testing equipment, comprising conductive elements mounted in a carrier in positions to engage the terminals of a multi-terminal electrical package. The conductive elements are connected via a flat cable to a remote test instrument. The profile of the clip is such that it may be connected to a multi-terminal electrical package while it is operating in an instrument having closely spaced circuit boards. Consequently, this clip eliminates the need for conventional extender boards in most test situations.

6 Claims, 3 Drawing Figures

LOW-PROFILE TEST CLIP ADAPTER

This is a continuation of application Ser. No. 883,983, filed Mar. 6, 1978 now abandoned.

BACKGROUND OF THE INVENTION

In the testing of electronic equipment containing a number of circuit boards including integrated circuits mounted in DIP's it is desirable to make test connections to the various terminals of the DIP's. In many cases it is best to test the electrical circuits while they are operating. Normally, circuit boards are removed from their normal operating environment and connected to a conventional extender board and connections are made to the DIP terminals using a conventional test probe or clip. In some cases, especially those involving high-frequency signals, the use of an extender board may introduce electrical interference into the circuit; thereby unacceptably altering the electrical characteristics of the circuit under test.

SUMMARY OF THE INVENTION

This invention relates to electrical connectors for making electrical connections to electronic circuits packaged in a DIP. More particularly, it relates to an electrical connector for making electrical connection to these circuits while they are in their normal operating environment.

The invention is realized by a device comprised of a low-profile test clip connected to a flat cable terminated with an electrical connector. In use, the test clip is electrically connected to a DIP mounted on a circuit board that has been removed from the equipment. The height of the test clip is such that the circuit board may be reinstalled in the equipment while the test clip is still connected to the DIP, without interferring with adjacent circuit boards. The flat cable is of such length that the electrical connector extends beyond the physical confines of the equipment and is accessible to conventional test probes.

The object of the present invention is to provide a means for electrically connecting to DIP's.

Another object of the present invention is to provide a means for electrically connecting to DIP's mounted on circuit boards that are installed in their normal operating environment inside the electronic equipment.

The foregoing and other objects and advantages of the present invention will become apparent from the following detailed description of the preferred embodiment thereof and from the attached drawing.

DETAILED DESCRIPTION OF THE INVENTION

Figure 1:
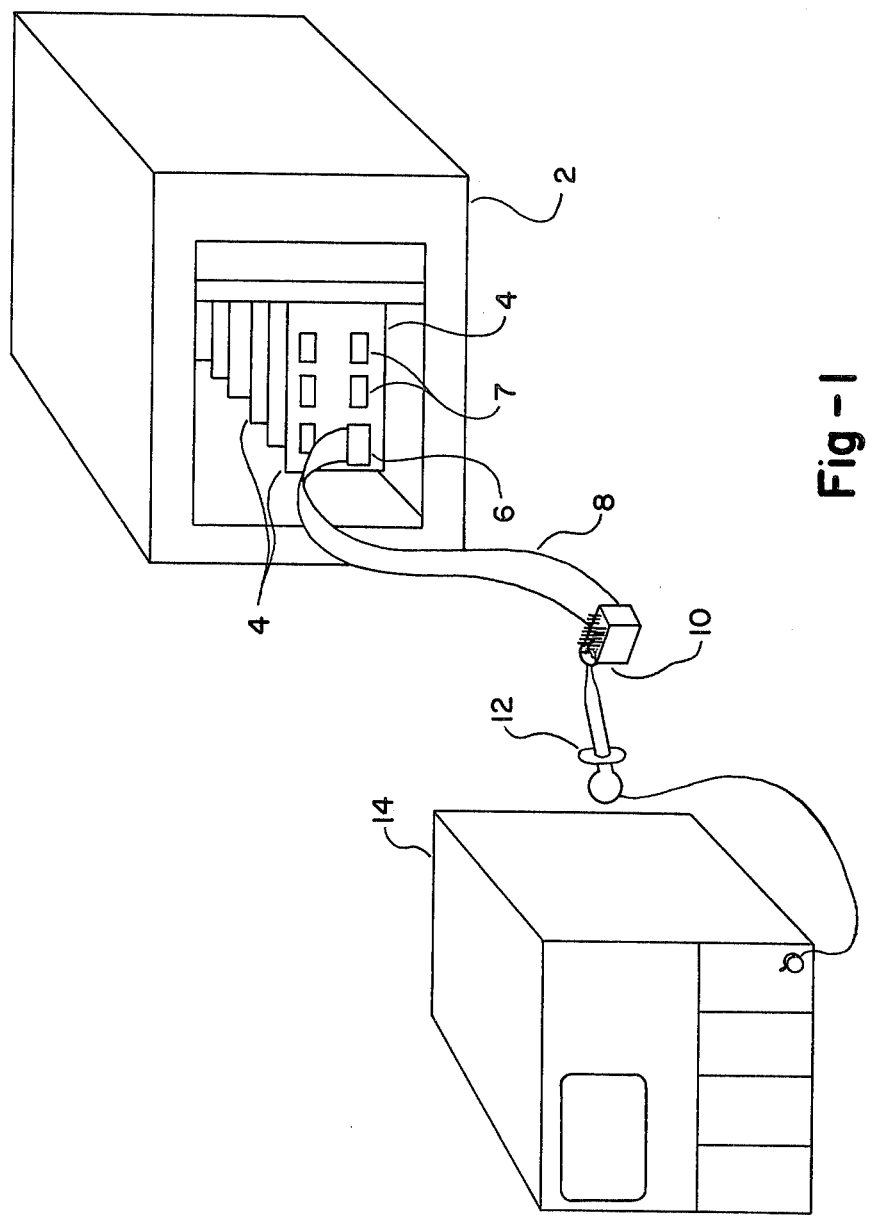
FIG. 1 is a block diagram showing the low-profile test clip adapter in a typical application.

Turning now to the drawings, a typical test situation using the present invention is shown in FIG. 1. Shown are a piece of electronic equipment 2, circuit boards 4 therein, and low-profile test clip 6 electrically connected to a DIP 7 on circuit board 4. A flat cable 8 connects test clip 6 to terminal block 10. Conventional test probe 12 is connected to a connector pin in terminal block 10 and carries signals to test instrument 14. With this arrangement the electrical characteristics of circuit board 4 may be determined while it is operating within electronic equipment 2.

In order to enable circuit board 4 to be operated within instrument 2 during tests instead of on a conventional extender board, low-profile test clip 6 is of such height as to allow circuit board 4 to be placed inside equipment 2 without interferring with adjacent circuit boards 4.

Figure 2:
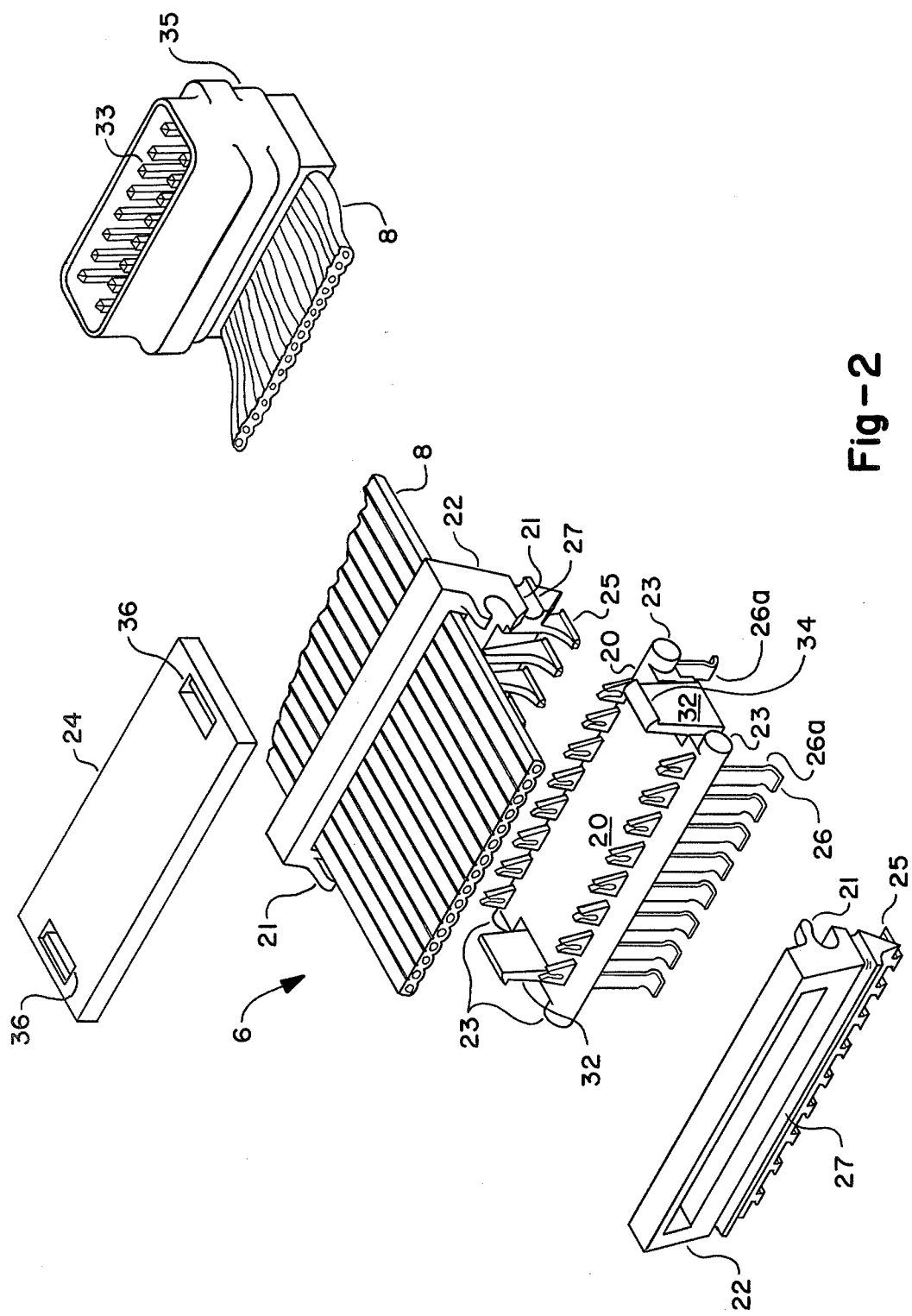
FIG. 2 is an exploded view of the low-profile test clip adapter showing the component parts thereof.
Figure 3:
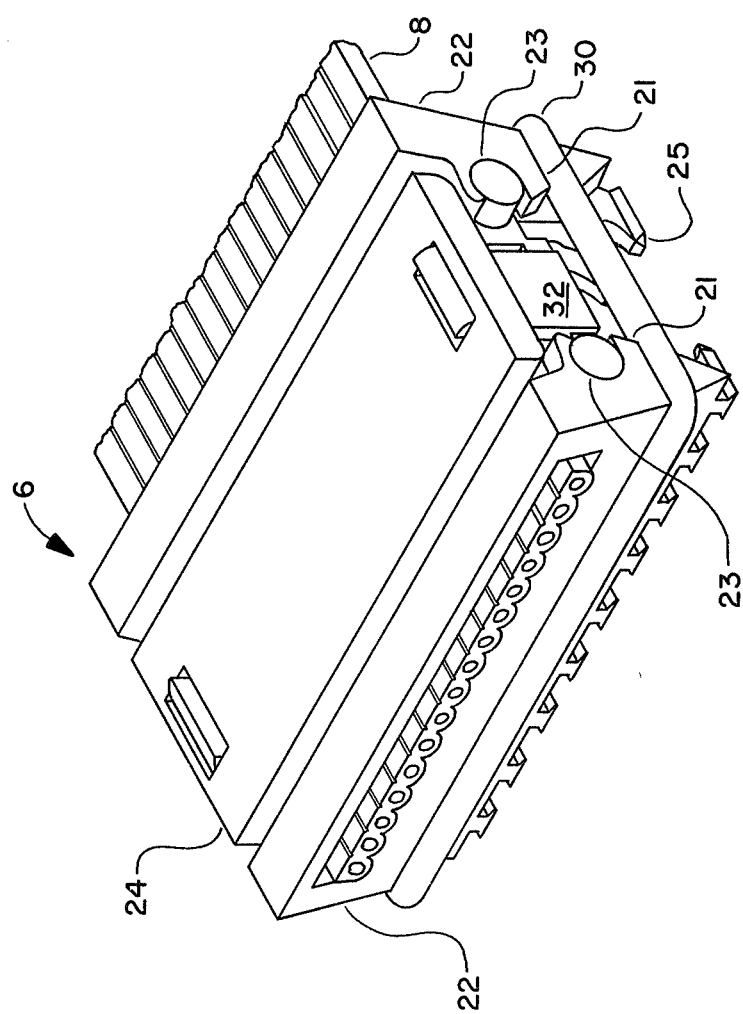
FIG. 3 shows an assembled low-profile test clip.

Low-profile test clip 6 as shown in FIG. 2 contains several parts including, a body 20, a pair of arms 22, and a cap 24. Body 20 is molded of a suitable plastic material and carries a plurality of gold-plated beryllium copper cantilever spring contacts 26 that provide electrical contact between the terminals of the DIP being tested and the conductors of flat cable 8. FIGS. 2 and 3 depict a total of sixteen spring contacts 26; however, it is obvious that any number of contacts may be carried by body 20 to accomodate the various configurations of DIP's.

The top portion of each spring contact 26 is fork-shaped so as to puncture and displace the insulation surrounding the conductors of flat cable 8 when it is fitted into place over spring contacts 26. Thus, electrical contact is made between the conductors of flat cable 8 and spring contacts 26. The bottom portion of each spring contact 26 springably engages and makes electrical contact with a respective terminal of the DIP being tested. The bottom portion of each contact 26 is provided with inwardly-directed arcuate-shaped projections 26a to enable the contact to easily engage a respective terminal of the DIP.

The two arms 22 are identical and they include C-shaped sections 21 which springably engage cylindrical projections 23 of body 20 so that arms 22 are pivotally mounted on body 20 as shown in FIG. 2. The bottom portion of each arm 22 contains spaced fingers 25 that are disposed between adjacent spring contacts to grip the body of the DIP; thereby ensuring good electrical contact between spring contacts 26 and the DIP terminals. Fingers 25 also protect and prevent the spring contacts from shorting to one another. The middle portion of each arm 22 covers and provides electrical insulation for spring contacts 26. The top portion of arms 22 are to be engaged to pivotally move the arms away from contacts 26 so that the contacts can easily engage the DIP terminals.

Arms 22 are pivotally mounted on body 20 via sections 21 and projections 23 so as to permit them to be pivoted toward and away from spring contacts 26; thus, allowing spring contacts 26 to fit over the DIP terminals. After arms 22 are pivotally mounted onto body 20, an O-ring 30 is mounted within grooves 27 of arms 22 thereby maintaining arms 22 in position on body 20 and providing spring bias to arms 22.

Body 20 contains latching arms 32 which include latching surfaces 34. Latching arms 32 extend through openings 36 in cap 24 when cap 24 is positioned on body 20. Latching surfaces 34 engage a mating surface of cap 24 as a result of the outwardly-directed spring action of arms 32 thereby latching cap 24 in position, insulating any exposed section of contacts 26, and retaining the electrical conductors of flat cable 8 in electrical contact with spring contacts 26.

Flat cable 8 contains a plurality of insulated conductors, sixteen such conductors are shown in FIG. 2. It is obvious, however, that any number of conductors may be included in flat cable 8 in order to accomodate the various configurations of DIP's. Flat cable 8 extends the signals carried by spring contacts 26 from the DIP terminals out beyond the physical confines of equipment 2.

Flat cable 8 is terminated with a conventional terminal block 10 surrounded by housing 35 which contains a plurality of connector pins 33. Sixteen connector pins are shown, but it is obvious that any number may be used in order to accomodate the corresponding number of conductors in flat cable 8. Conventional test probe 12 from test instrument 14 may be connected to connector pins 33 to perform electrical testing on electronic circuits within the DIP. Alternately, flat cable 8 may be terminated in a conventional connector designed to plug directly into test instrument 14 without need of test probe 12.

While an embodiment of the present invention has been shown and described, it will be apparent to those skilled in the art that changes and modifications may be made without departing from the present invention in its broad aspects. The appended claims are therefore intended to cover all such changes and modifications as fall within the true spirit and scope of the invention.

The invention is claimed in accordance with the following:

1. A low-profile clip for making electrical connection to the terminals of a multi-terminal electronic component while the component is operating in an instrument having closely spaced circuit boards, the device comprising:
   a cable comprising a plurality of insulated electrical conductors for carrying electrical signals from a test instrument to the electronic component being tested;
   a body having spaced electrical contact means rigidly mounted therein, said electrical contact means including inwardly-directed, arcuate-shaped terminal-contact sections for providing electrical connection with the terminals of the electronic component and conductor-connecting sections for making electrical contact with said plurality of electrical conductors of said cable; and
   a pair of arms pivotally mounted on said body and comprising finger-like projections for gripping the electronic component between each pair of adjacent terminals thereof, the top portion of each of said arms including a slot for passing said cable therethrough.

2. The low-profile clip according to claim 1 wherein said arms include c-shaped sections that springably engage cylindrical projections on said body for pivotally mounting said arms on said body.

3. The low-profile clip according to claim 1 wherein said body further comprises a cap for covering said conductor-connecting sections of said electrical contact means.

4. The low-profile clip according to claim 1 wherein said arms are secured to said body via an o-ring or other elastic member.

5. The low-profile clip according to claim 1 wherein said conductor-connecting sections are fork-shaped for displacing the insulation surrounding said plurality of electrical conductors.

6. The low-profile clip according to claim 1 wherein said cable is a flat cable.

* * * * *